US011429148B2

(12) United States Patent
Lee et al.

(10) Patent No.: US 11,429,148 B2
(45) Date of Patent: Aug. 30, 2022

(54) PORTABLE ELECTRONIC DEVICE (71) Applicant: Quanta Computer Inc., Taoyuan (TW)

(72) Inventors: Kuo-Hsien Lee, Taoyuan (TW); Shen-Pu Hsieh, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 47 days.

(21) Appl. No.: 16/785,013

(22) Filed: Feb. 7, 2020

(65) Prior Publication Data

US 2021/0089082 A1 Mar. 25, 2021

(30) Foreign Application Priority Data

Sep. 20, 2019 (TW) .................. 108134117

(51) Int. Cl.
*G06F 1/16* (2006.01)
*G06F 1/20* (2006.01)
*H05K 7/20* (2006.01)
*H02K 7/116* (2006.01)

(52) U.S. Cl.
CPC .......... *G06F 1/1624* (2013.01); *G06F 1/1616* (2013.01); *G06F 1/1671* (2013.01); *G06F 1/203* (2013.01); *G06F 1/206* (2013.01); *H02K 7/116* (2013.01); *H05K 7/20145* (2013.01); *H05K 7/20172* (2013.01); *G06F 2200/201* (2013.01)

(58) Field of Classification Search
CPC ........ G06F 1/1624; G06F 1/206; G06F 1/203; G06F 1/1616; G06F 1/1671; G06F 2200/201; H05K 7/20145; H05K 7/20172; H02K 7/116

See application file for complete search history.

(56) References Cited

U.S. PATENT DOCUMENTS

| 5,754,395 | A | * | 5/1998 | Hsu | G06F 1/1616 361/679.11 |
| 6,078,495 | A | * | 6/2000 | Cipolla | G06F 1/203 361/679.46 |
| 6,157,537 | A | * | 12/2000 | Cheng | G06F 1/203 165/80.3 |
| 7,719,826 | B1 | * | 5/2010 | Chang | G06F 1/1656 361/679.17 |

(Continued)

FOREIGN PATENT DOCUMENTS

| CN | 108594970 A | 9/2018 |
| TW | 200917929 A | 4/2009 |

(Continued)

*Primary Examiner* — Anthony M Haughton
*Assistant Examiner* — Theron S Milliser
(74) *Attorney, Agent, or Firm* — Rabin & Berdo, P.C.

(57) ABSTRACT

A portable electronic device includes a mainframe computer, a sliding cover and an electrically-controlled driving device. The mainframe computer includes a base, a receiving recess formed on the base, and a plurality of vent holes which are evenly distributed on the base. The sliding cover slidably covers the receiving recess and the vent holes. The electrically-controlled driving device includes an electric motor and a linkage set. The linkage set is connected to the electric motor and the sliding cover for moving the sliding cover with the electric motor, so that the sliding cover is allowed to cover the vent holes and expose the vent holes from the base.

8 Claims, 11 Drawing Sheets (56) References Cited

U.S. PATENT DOCUMENTS

| | | | |
|---|---|---|---|
| 7,889,500 B2* | 2/2011 | Yang | G06F 1/203 |
| | | | 361/695 |
| 8,542,486 B2* | 9/2013 | Lin | G06F 1/203 |
| | | | 361/693 |
| 10,506,739 B2* | 12/2019 | Lee | G06F 1/1624 |
| 10,534,408 B2* | 1/2020 | Cheng | G06F 1/1616 |
| 10,582,638 B2* | 3/2020 | Ye | F24F 13/15 |
| 10,678,312 B2* | 6/2020 | Hsu | G06F 1/1616 |
| 11,016,528 B2* | 5/2021 | Lin | G06F 1/1616 |
| 2007/0103866 A1* | 5/2007 | Park | H05K 7/20972 |
| | | | 361/695 |
| 2010/0165567 A1* | 7/2010 | Shih | G06F 1/1667 |
| | | | 361/679.48 |
| 2010/0182748 A1* | 7/2010 | Huang | G06F 1/1656 |
| | | | 361/690 |
| 2010/0214743 A1* | 8/2010 | Huang | G06F 1/1616 |
| | | | 361/692 |
| 2012/0127652 A1* | 5/2012 | Lin | G06F 1/203 |
| | | | 361/679.46 |
| 2019/0208662 A1* | 7/2019 | Lee | G06F 1/1624 |
| 2020/0142456 A1* | 5/2020 | Hsu | G06F 1/1681 |
| 2020/0183451 A1* | 6/2020 | Lin | G06F 1/1666 |
| 2020/0264672 A1* | 8/2020 | Morino | G06F 1/203 |

FOREIGN PATENT DOCUMENTS

| | | |
|---|---|---|
| TW | I533785 B | 5/2016 |
| TW | I547234 B | 8/2016 |
| TW | M565816 U | 8/2018 |

* cited by examiner

PORTABLE ELECTRONIC DEVICE

CROSS-REFERENCE TO RELATED APPLICATION

This application claims priority to Taiwan Application Serial Number 108134117, filed Sep. 20, 2019, which is herein incorporated by reference.

BACKGROUND

Field of Disclosure

The present disclosure relates to a portable electronic device, and in particular to a portable electronic device having a sliding cover thereon.

Description of Related Art

With the advancement of technology, the computing performance of a portable electronic device (e.g., notebook computer) is increasingly enhanced, and the profile of the portable electronic device is gradually compacter, thinner and shorter. However, with the thin, light and short profile of the portable electronic device, the heat dissipation requirements of the portable electronic device have already been enhanced, so that a suitable heat dissipation mechanism is more necessary to be provided in the portable electronic device for excluding the thermal energy produced in the portable electronic device.

However, when the heat dissipation mechanism installed in the portable electronic device is so large to overly occupy the internal space of the portable electronic device, a bottleneck that the portable electronic device needs heat-dissipation but fails to downsize the heat dissipation mechanism in the portable electronic device is caused.

Therefore, how to develop a solution to improve the foregoing deficiencies and inconvenience is an important issue that relevant persons engaged in the industry are currently unable to delay.

SUMMARY

According to one embodiment of the present disclosure, the portable electronic device includes a mainframe computer, a sliding cover and at least one electrically-controlled driving device. The mainframe computer includes a base, a receiving recess and a plurality of vent holes. The receiving recess is concavely formed on a top surface of the base. The vent holes are distributed on the top surface of the base, respectively. The sliding cover slidably covers the receiving recess and the vent holes. The electrically-controlled driving device includes an electric motor and a linkage set. The linkage set is connected to the electric motor and the sliding cover for moving the sliding cover with the electric motor, so that the sliding cover is allowed to cover the vent holes and expose the vent holes from the base.

Thus, through the construction of the embodiments above, not only the heat dissipation efficiency of the portable electronic device can be improved, but also the internal space occupied by the heat dissipation mechanism can be reduced, thereby improving the overall size of the portable electronic device.

The above description is merely used for illustrating the problems to be resolved, the technical methods for resolving the problems and their efficacies, etc. The specific details of the disclosure will be explained in the embodiments below and related drawings.

BRIEF DESCRIPTION OF THE DRAWINGS

In order that the foregoing and other objectives, features, advantages and embodiments of the present disclosure can be more clearly understood, the accompanying drawings are described as follows.

DESCRIPTION OF THE EMBODIMENTS

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Figure 1:
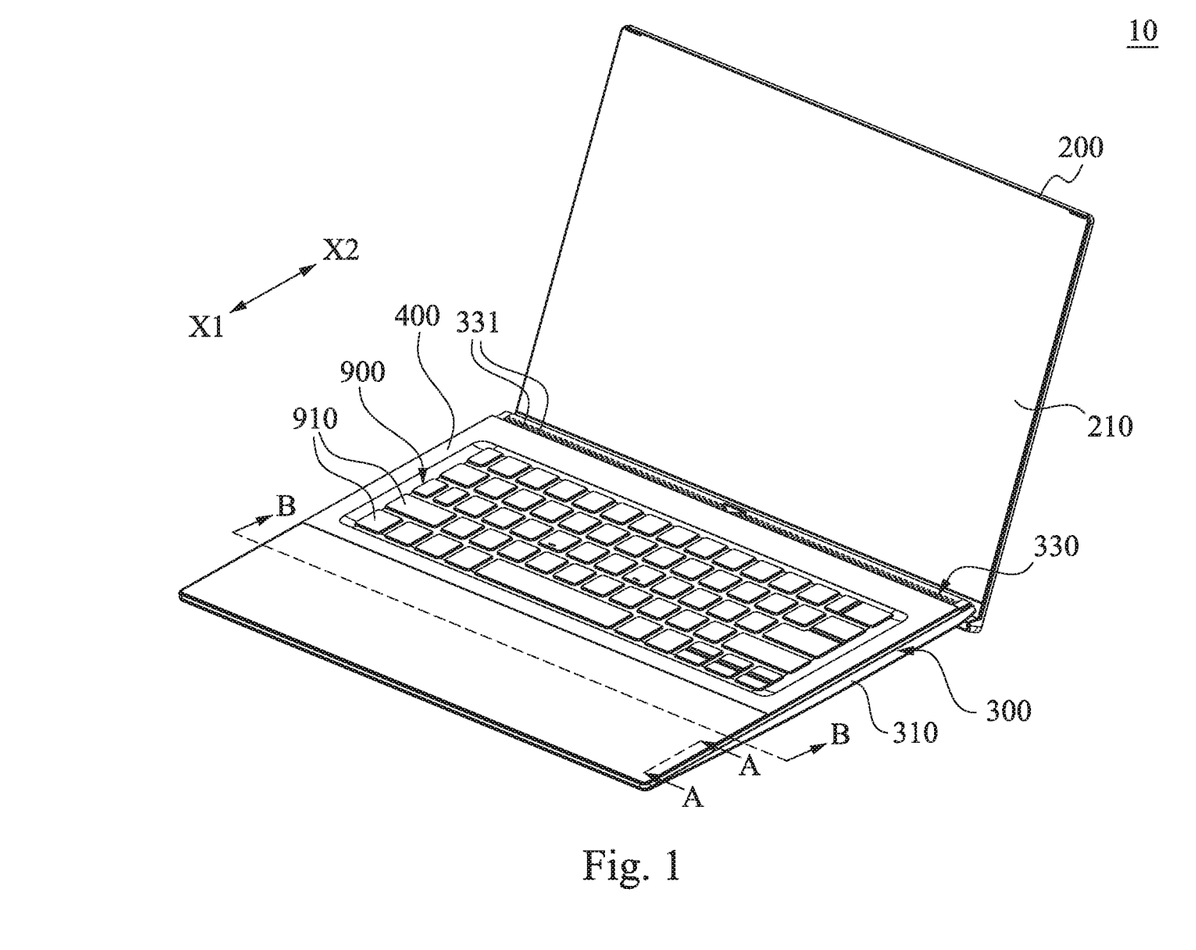
FIG. 1 is a perspective view of a portable electronic device according to one embodiment of the present disclosure.
Figure 2:
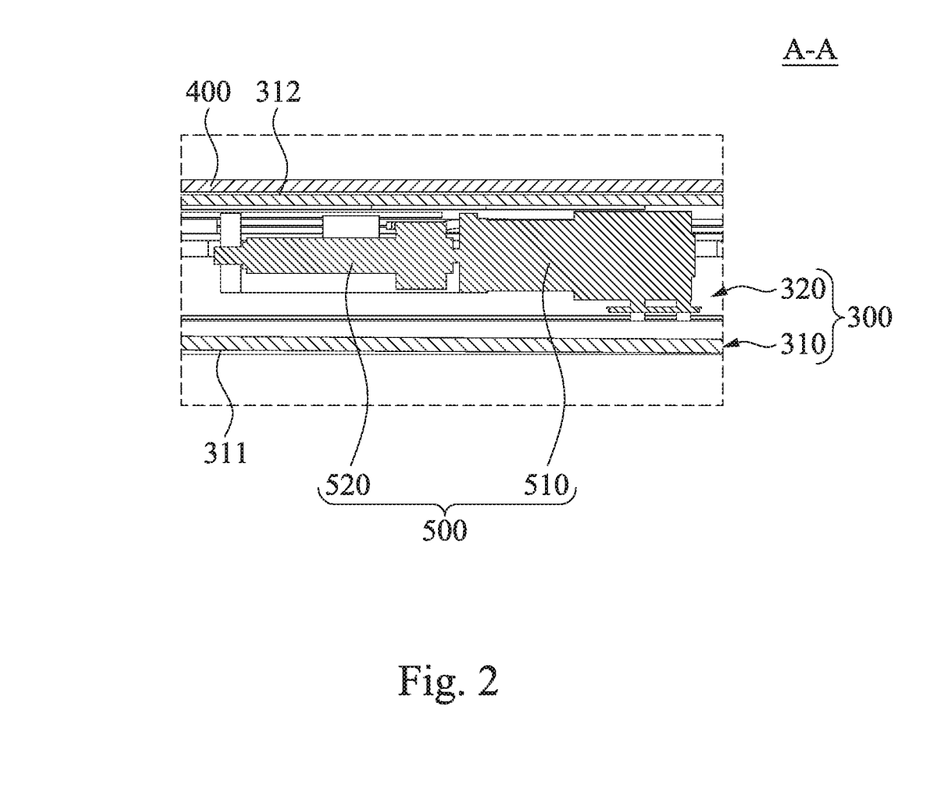
FIG. 2 is a partial cross-sectional view taken along a line A-A of FIG. 1.
Figure 3:
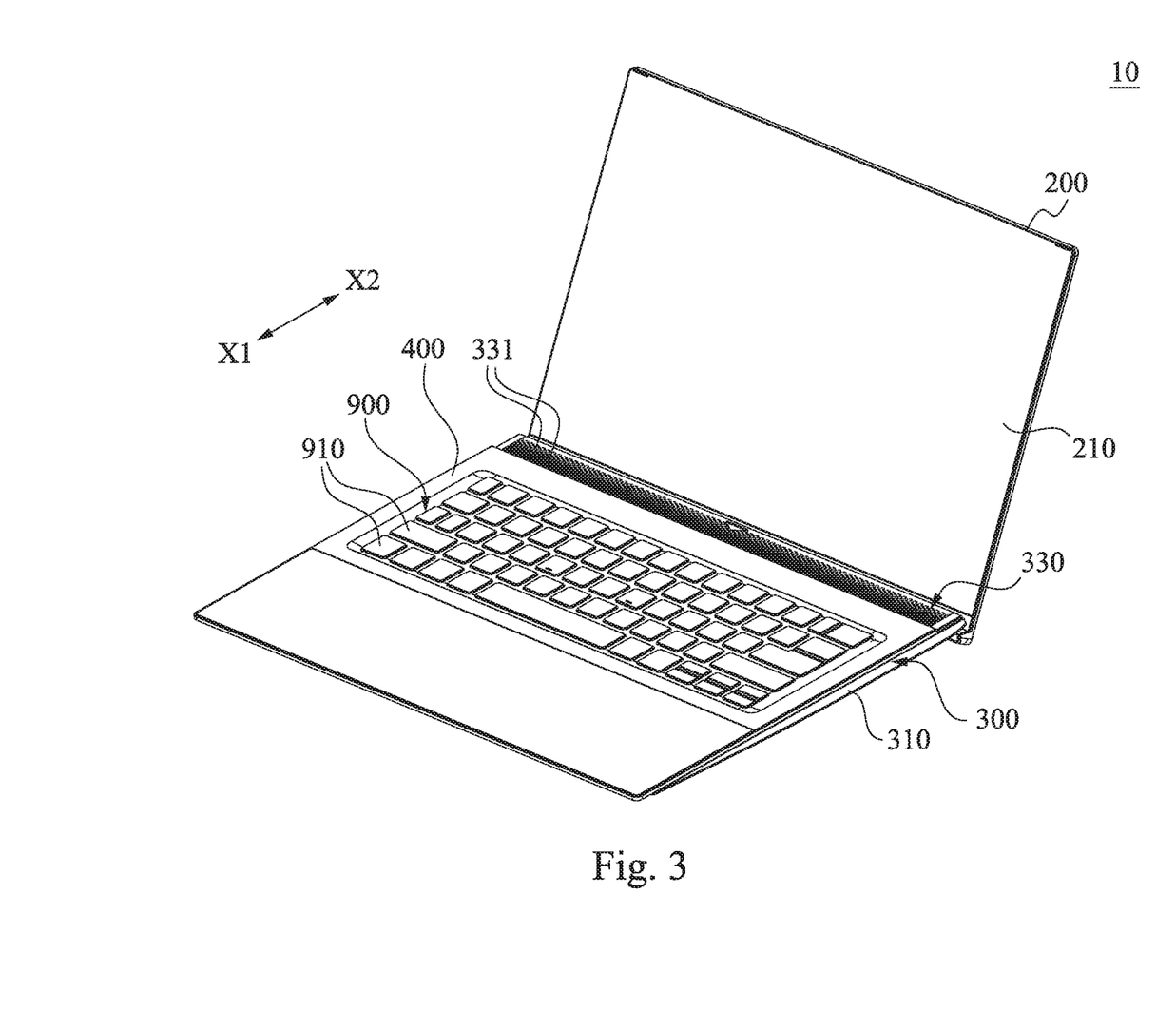
FIG. 3 is an operation view of FIG. 1.

Reference is now made to FIG. 1 to FIG. 3, in which FIG. 1 is a perspective view of a portable electronic device according to one embodiment of the present disclosure, FIG. 2 is a partial cross-sectional view taken along a line A-A of FIG. 1, and FIG. 3 is an operation view of FIG. 1. As shown in FIG. 1 to FIG. 3, in this embodiment, the portable electronic device includes a mainframe computer 300, a sliding cover 400 and two electrically-controlled driving devices 500, however, the present disclosure is not limited thereto, in other embodiments, the electrically-controlled driving device 500 only can be single one in number. The mainframe computer 300 includes a base 310 and a receiving recess 320. The base 310 includes a bottom surface 311 and a top surface 312 which are opposite to each other. The receiving recess 320 is concavely formed on one part of the top surface of the base 310 for accommodating most of working components in the mainframe computer 300, the working components, for example, can be a motherboard, a hard disk, a battery, a display unit, a central processing unit and other conventional components (not shown). Another part of the top surface 312 of the base 310 is formed with a plurality of vent holes 331. The vent holes 331 are evenly distributed on the top surface 312 of the base 310, respectively. Each of the vent holes 331 penetrates through the top surface 312 of the base 310, and is in communication with the receiving recess 320. The sliding cover 400 slidably covers the receiving recess 320, at least a part of these vent holes 331 and the top surface 312 of the base 310. The electrically-controlled driving devices 500 are oppositely disposed within the receiving recess 320. Each of the electrically-controlled driving devices 500 includes an electric motor 510 and a linkage set 520. The electric motor 510 is fixedly disposed within the receiving recess 320 or the sliding cover 400. The linkage set 520 is connected to the electric motor 510 and the sliding cover 400 for synchronously moving the sliding cover 400 with the electric motor 510.

More specifically, the base 310 of the mainframe computer 300 further has a decorative plate 330. The decorative plate 330 also is disposed on the another part of the top surface 312 of the base 310 which is adjacent to the receiving recess 320. The vent holes 331 are evenly distributed on the decorative plate 330. Each of the vent holes 331 penetrates through the decorative plate 330, and is in communication with the receiving recess 320. However, the present disclosure is not limited thereto, in other embodiments, the vent holes 331 may be directly formed on the top surface 312 of the base 310.

Figure 4:
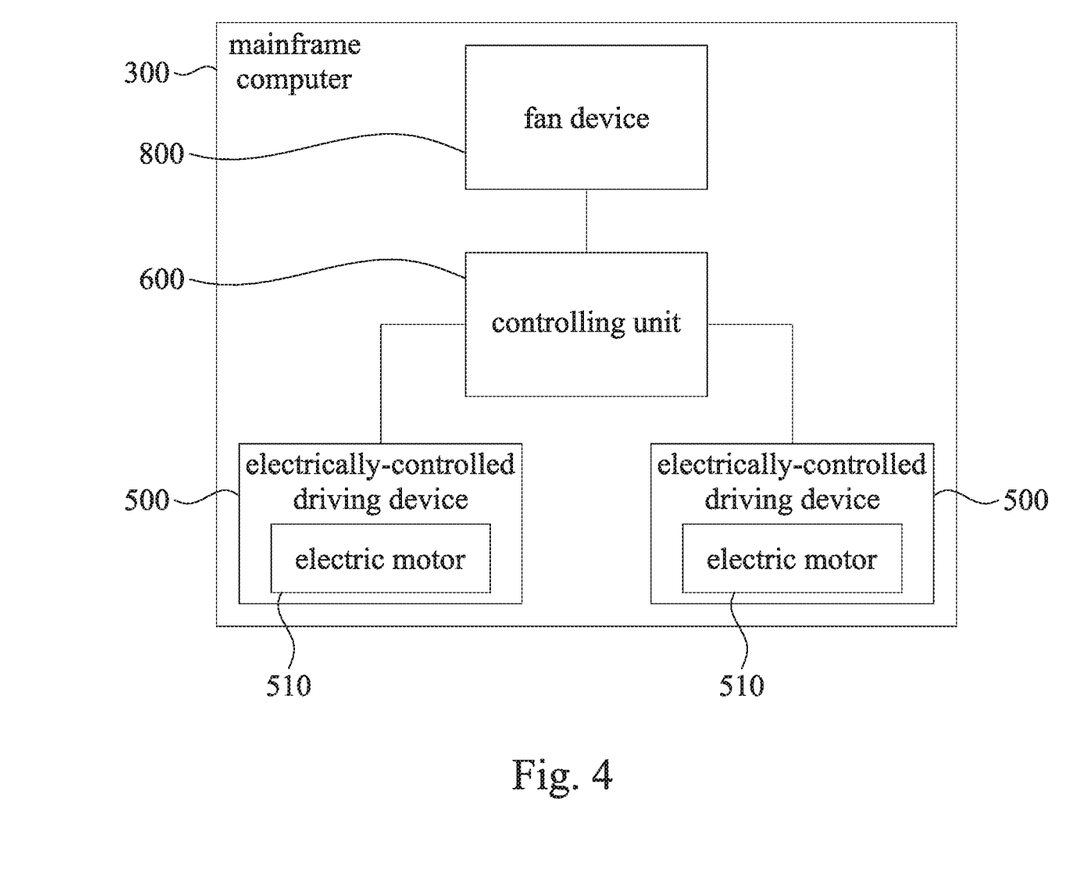
FIG. 4 is a partial electric block diagram of the mainframe computer of FIG. 1.
Figure 5A:
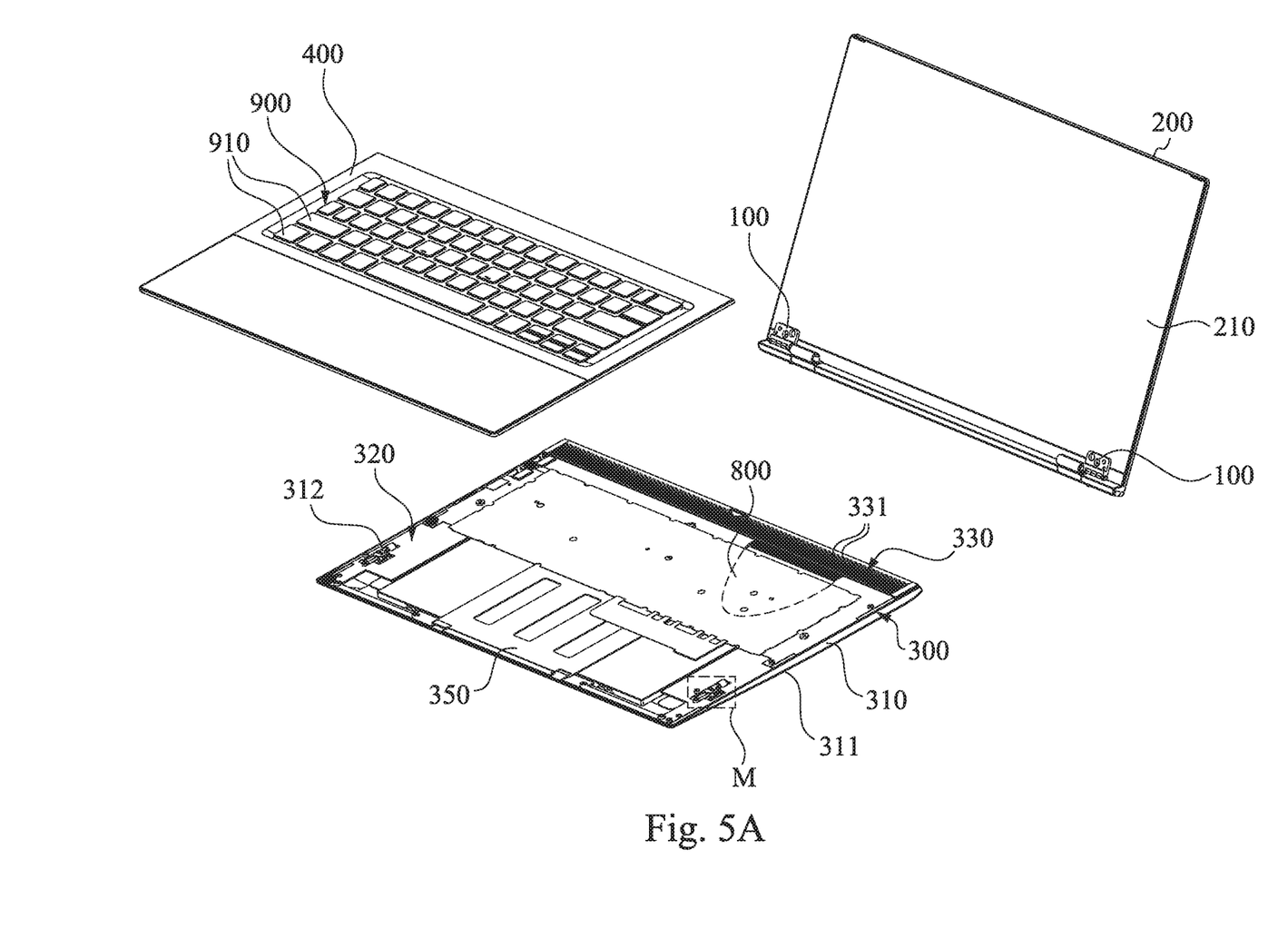
FIG. 5A is a partial exploded view of the mainframe computer of FIG. 1.
Figure 5B:
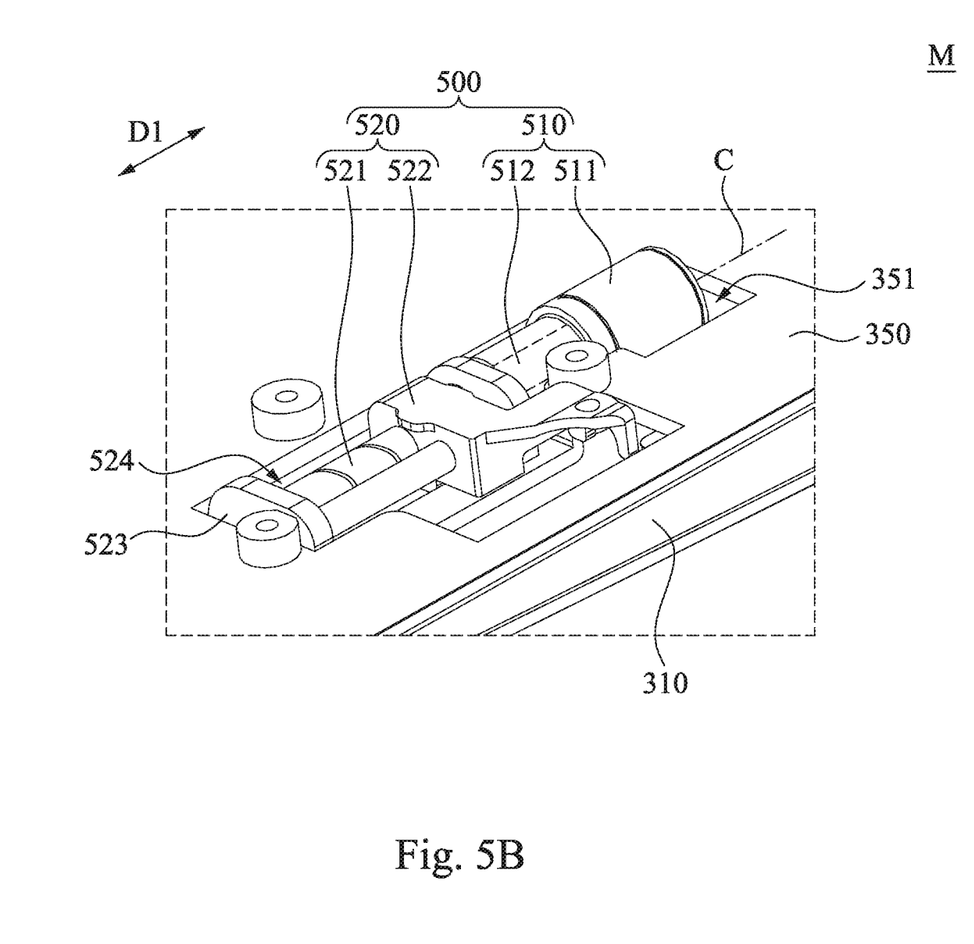
FIG. 5B is a partial enlarged view of a region M in FIG. 5A.
Figure 6:
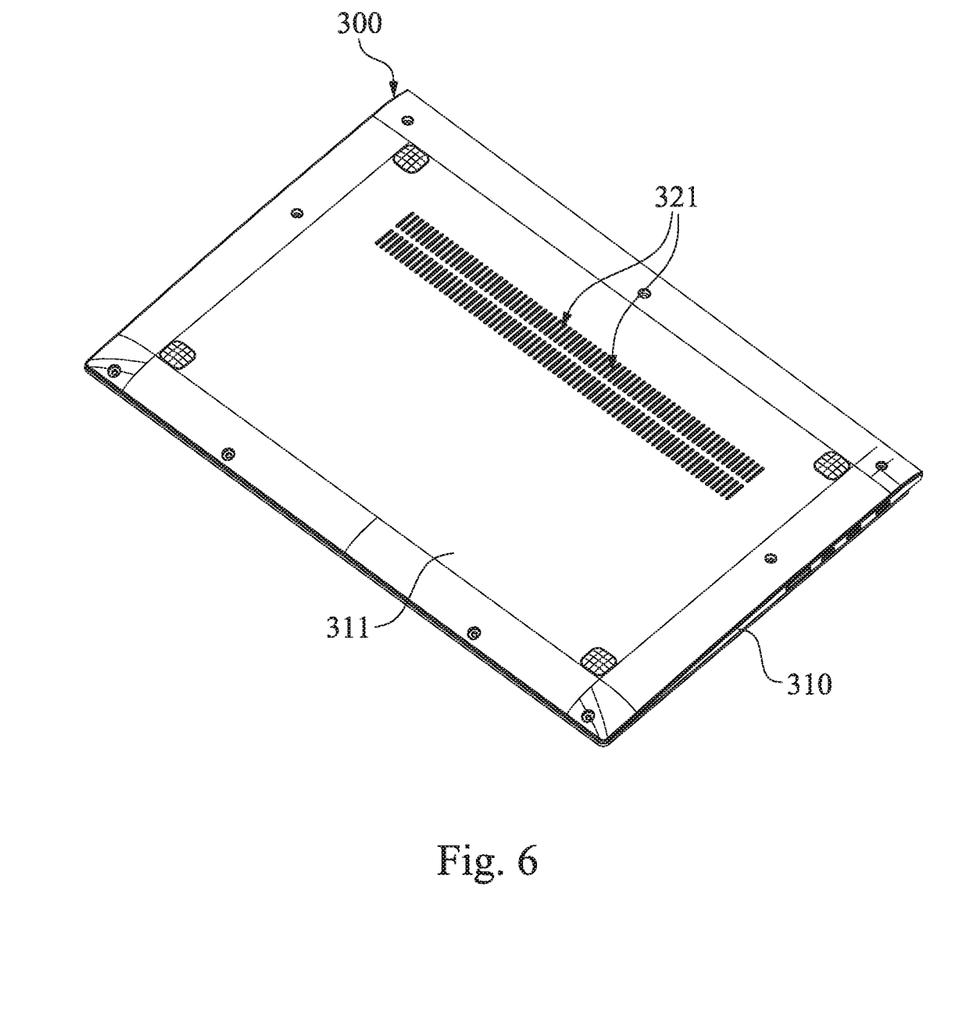
FIG. 6 is a bottom view of the mainframe computer in FIG. 1.

Reference is now made to FIG. 4 to FIG. 6, in which FIG. 4 is a partial electric block diagram of the mainframe computer 300 of FIG. 1, FIG. 5A is a partial exploded view of the mainframe computer 300 of FIG. 1, FIG. 5B is a partial enlarged view of a region M in FIG. 5A, FIG. 6 is a bottom view of the mainframe computer 300 in FIG. 1. As shown in FIG. 4 to FIG. 6, the mainframe computer 300 further includes a controlling unit 600 and a fan device 800. The fan device 800 is disposed within the receiving recess 320, and is used to draw airflows outwards from the mainframe computer 300 through the vent holes 331. The controlling unit 600 is disposed within the receiving recess 320, and the controlling unit 600 is able to control the electrically-controlled driving devices 500 to synchronously move the sliding cover 400 together, so that the sliding cover 400 is moved to cover the vent holes 331 (FIG. 1) or expose the vent holes 331 from the base 310 (FIG. 3). Also, the bottom surface 311 of the base 310 is formed with a plurality of air inlet holes 321 which are uniformly distributed on one bottom surface 311 of the base 310. In one embodiment, the air inlet holes 321 are in communication with the vent holes 331 through the receiving recess 320. The fan device 800 produces airflows introduced from the air inlet holes 321 to the vent holes 331, and sends them outwards from the base 310 through the vent holes 331. However, the present disclosure is not limited thereto. In other embodiments, the vent holes may also be used as sound holes of the portable electronic device.

Thus, when the controlling unit 600 accepts a trigger instruction for enhancing the heat dissipation efficiency, the controlling unit 600 triggers the electric motors 510 so that the electric motors 510 synchronously move the sliding cover 400 together in a same direction (e.g., a first sliding direction X1), thus, the sliding cover 400 can smoothly move away to expose the vent holes 331 from the base 310 (FIG. 3) so as to increase the volume of ventilation channels and enhance the heat dissipation efficiency of the portable electronic device 10, thereby reducing the possibility of the mainframe computer 300 getting malfunction, and the working life of the working components. On the contrary, when the controlling unit 600 accepts another trigger instruction for resuming the heat dissipation efficiency, the controlling unit 600 triggers the electric motors 510 to synchronously move the sliding cover 400 together in another same direction (e.g., a second sliding direction X2), thus, the sliding cover 400 can smoothly move back to hide at least one part of the vent holes 331 (FIG. 1).

As shown in FIG. 4 to FIG. 5B, in the embodiment, each of the electric motors 510 includes a motor member 511 and a rotating shaft 512. The motor member 511 is fixedly coupled on the base 310. The rotating shaft 512 is operably disposed in the motor member 511 to be rotated by the motor member 511, and the rotating shaft 512 extends outwards from one end of the motor member 511. The electric motor 510 is a stepping motor, however, the present disclosure is not limited thereto, in another embodiment, the electric motor 510 may also be a servo motor or another brushless motor. The portable electronic device 10 further includes a guide frame 523. The guide frame 523 is disposed within the receiving recess 320, fixedly connected to the base 310 and abuts against with the end of the motor member 511. The guide frame 523 is defined to form a position-limiting space 524 therein for receiving the linkage set 520. For example, the linkage set 520 includes a stud 521 and a linear moving member 522. The stud 521 is coaxially fixed to the rotating shaft 512 of the electric motor 510, and rotatably located in the position-limiting space 524. The linear moving member 522 is screwed on the stud 521, and movably limited within the position-limiting space 524, for linearly moving in relation to the stud 521 in the first linear direction D1 which is parallel to a shaft center line C of the rotating shaft 512 of the electric motor 510.

As shown in FIG. 5B, the base 310 further includes a middle frame 350. The middle frame 350 is fixed in the receiving recess 320, and the middle frame 350 is provided with two openings 351 which are oppositely arranged thereon, and respectively penetrated through the middle frame 350. Each of the openings 351 exactly receives one of the electrically-controlled driving devices 500, so that each of the electrically-controlled driving devices 500 is connected to the sliding cover 400 through the corresponding opening 351.

Figure 7A:
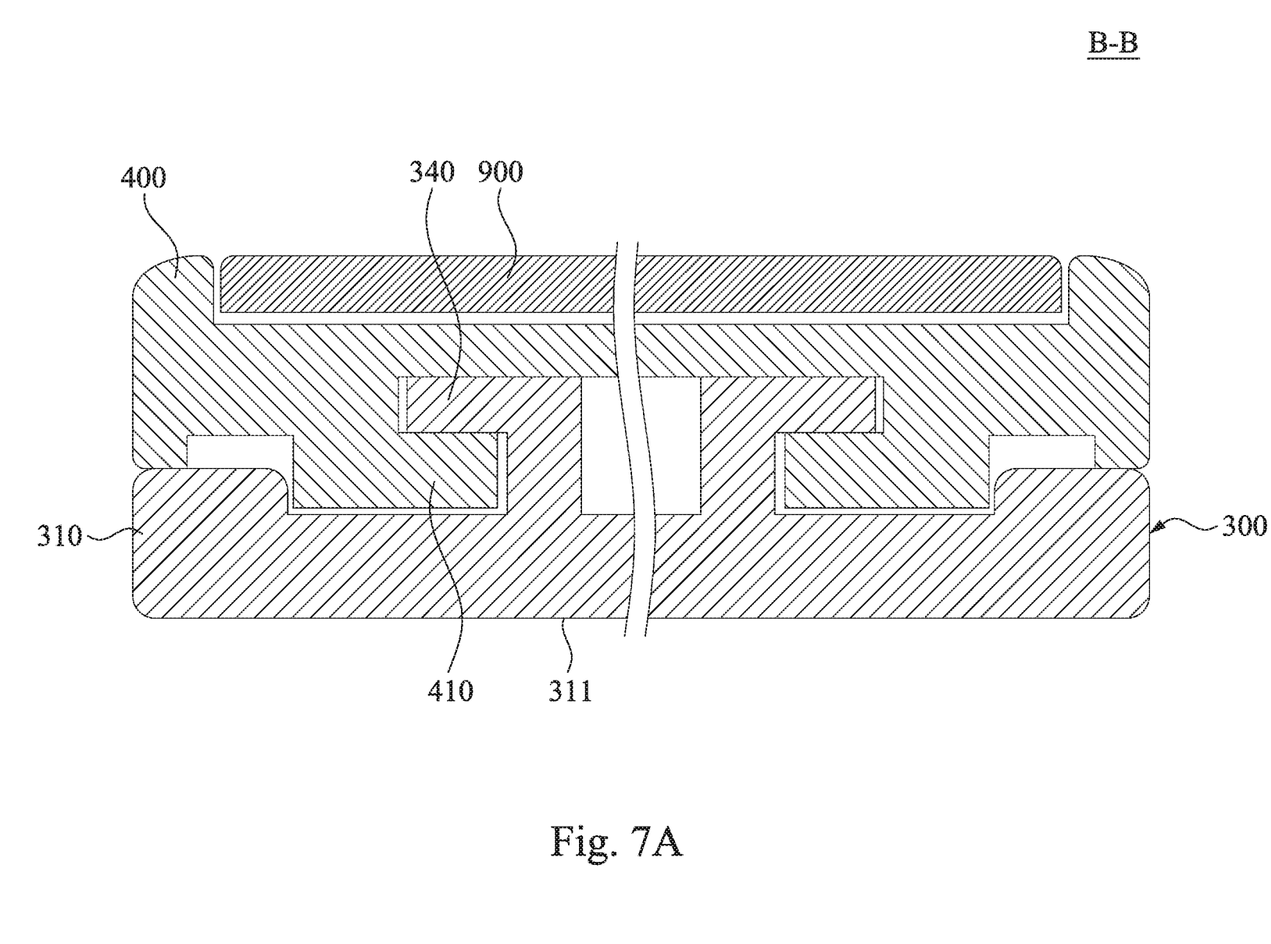
FIG. 7A is a partial cross-sectional view taken along a line B-B of FIG. 1.

FIG. 7A is a partial cross-sectional view taken along a line B-B of FIG. 1. As shown in FIG. 1 and FIG. 7A, the mainframe computer 300 is provided with two first guide rails 340. The first guide rails 340 are oppositely formed on two opposite sides of the base 310. The sliding cover 400 is provided with two second guide rails 410. The second guide rails 410 are oppositely formed on two opposite sides of the sliding cover 400, and extend towards the bottom surface 311 of the base 310. Each of the first guide rails 340 is slidably connected to one of the second guide rails 410, and the long axis direction of the second guide rail 410 and the long axis direction of the first guide rail 340 are parallel to each other. Thus, through the mutual cooperation of the second guide rails 410 and the first guide rails 340, the sliding cover 400 can slide linearly relative to the mainframe computer 300. However, the present disclosure is not limited to the mechanism types that render the sliding cover 400 to slide relative to the mainframe computer 300.

As shown in FIG. 5A and FIG. 7A, in this embodiment, the portable electronic device 10 is a notebook computer; however, the present disclosure is not limited thereto. In other embodiments, the portable electronic device 10 may also be a smart mobile phone. More specifically, the portable electronic device 10 further includes a pivot device 100, a upper cover portion 200 and a screen portion 210. The upper cover portion 200 is pivotally connected to the base 310 through the pivot device 100. The screen portion 210 is located on the upper cover portion 200. The mainframe computer 300 further includes a keyboard device 900. The keyboard device 900 is electrically connected to the controlling unit 600, and disposed on one surface of the sliding cover 400 facing away from the receiving recess 320 so as to be moved with the sliding cover 400 together.

The present disclosure is not limited to any control mode for driving the sliding cover 400. For example, a specific program or software loaded in the portable electronic device 10 directly sends the aforementioned trigger instruction to synchronously move the sliding cover 400. However, the present disclosure is not limited to this. In other embodiments, the mainframe computer 300 includes a pressing key 910 (e.g., hot key). The pressing key 910 may be an independent key of the base 310 or anyone of pressing keys of the keyboard device 900. Thus, according to the aforementioned trigger instruction of the pressing key 910, when one of pressing keys of the keyboard device is triggered, the controlling unit 600 controls the electrically-controlled driving devices 500 to move the sliding cover 400 to cover these vent holes 331 (FIG. 1), or expose these vent holes 331 from the base 310 (FIG. 3). In another specific embodiment, when the controlling unit 600 detects that the internal environment temperature of the portable electronic device 10 reaches a preset temperature, the controlling unit 600 is triggered to send the aforementioned trigger instruction.

Figure 7B:
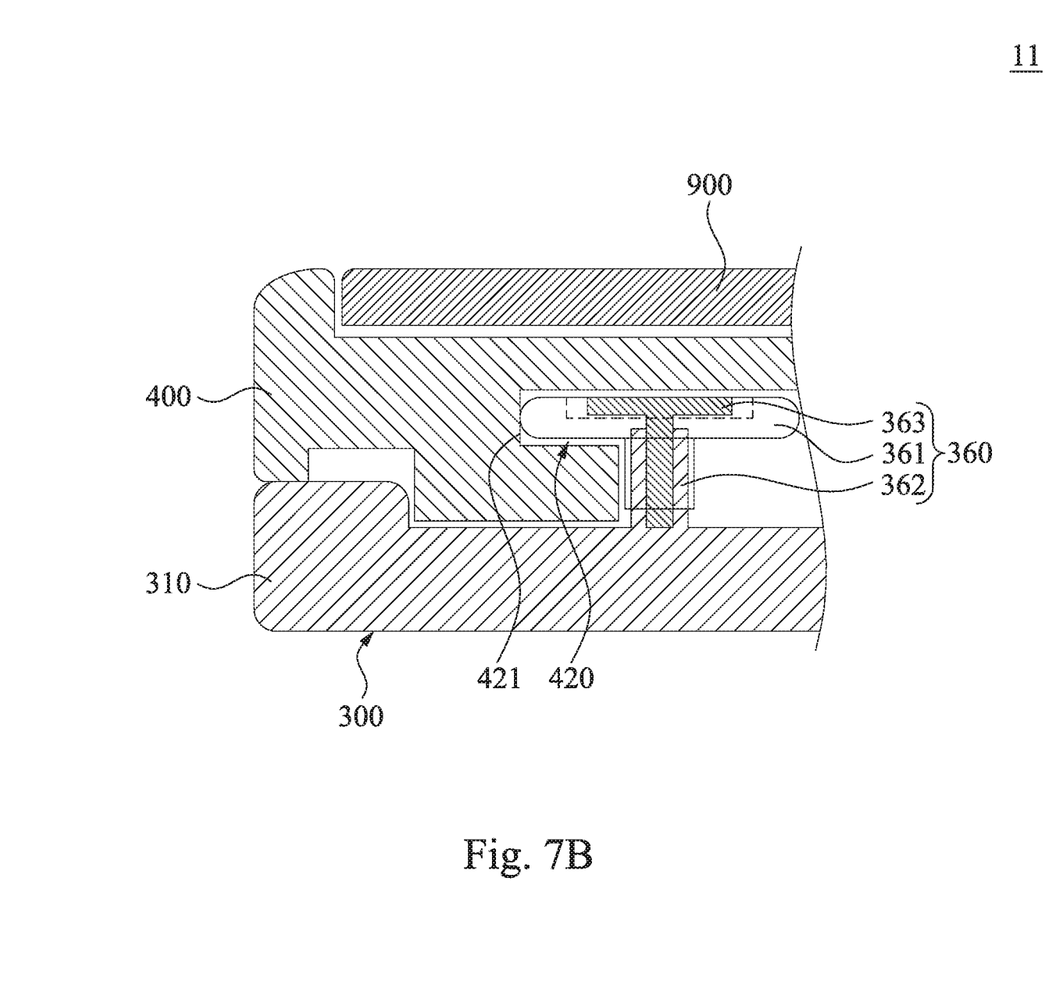
FIG. 7B is a partial cross-sectional view of a portable electronic device according to one embodiment of the present disclosure, and the cross-sectional position of FIG. 7B is same as the cross-sectional position in FIG. 7A.

FIG. 7B is a partial cross-sectional view of a portable electronic device 11 according to one embodiment of the present disclosure, and the cross-sectional position of FIG. 7B is same as the cross-sectional position in FIG. 7A. In one specific embodiment, as shown in FIG. 7B, the portable electronic device 11 of the specific embodiment is substantially the same as the portable electronic device 10 of the foregoing embodiment above. One of the differences is that, the sliding cover 400 of the portable electronic device 11 in this embodiment is slidable linearly in relation to the mainframe computer 300 through the cooperation of roller mechanisms. More specifically, the sliding cover 400 includes two guide grooves 420. The guide grooves 420 are oppositely formed on two opposite sides of the sliding cover 400. The mainframe computer 300 is provided with two roller mechanisms 360. The roller mechanisms 360 are oppositely formed on two opposite sides of the base 310, and each of the roller mechanisms 360 is rotatably disposed in one of the guide grooves 420. Each of the roller mechanisms 360 includes at least one roller 361 and a protruding post 362. The roller 361 is pivotally provided at one end of the protruding post 362 through a bolt 363, and the roller 361 is located in the respect guide groove 420 to abut against the inner wall 421 of the guide groove 420, so that the roller 361 is rotatable along the inner wall 421 of the guide groove 420. Thus, while the roller 361 is rotated to move against the inner wall 421 of the guide groove 420, the sliding cover 400 can slide relative to the mainframe computer 300 more smoothly.

Figure 8:
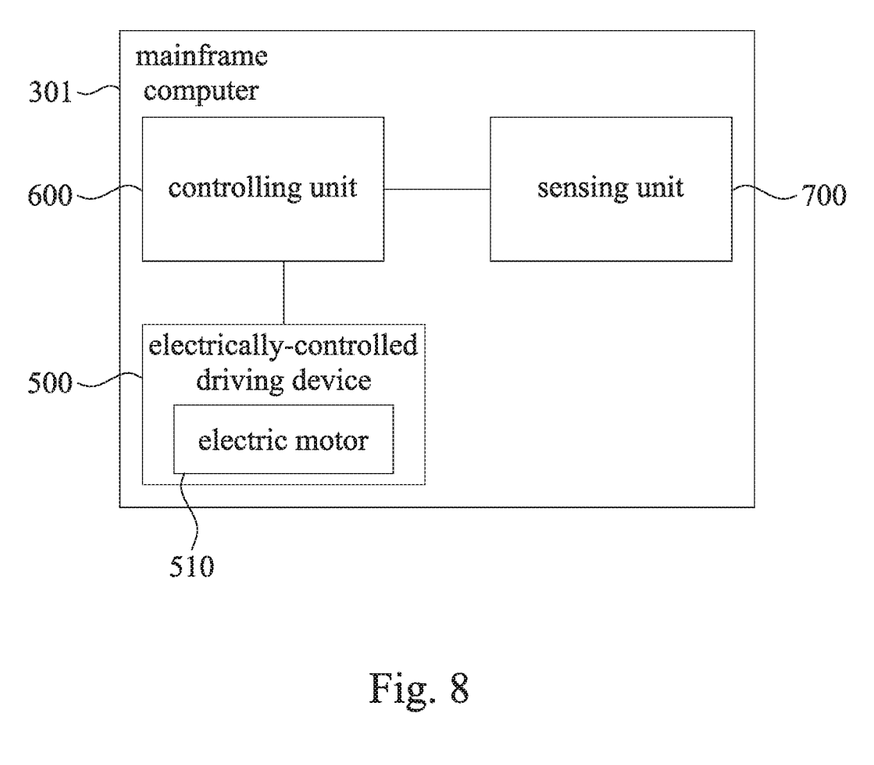
FIG. 8 is an electric block diagram of the mainframe computer in FIG. 1 according to an embodiment of the present disclosure.

FIG. 8 is an electric block diagram of the mainframe computer 301 in FIG. 1 according to an embodiment of the present disclosure. As shown in FIG. 5A and FIG. 8, in this embodiment, the mainframe computer 301 further includes a sensing unit 700. The sensing unit 700 is electrically connected to the controlling unit 600. Thus, whenever a user would like to use the portable electronic device 10 to lift the upper cover portion 200 away from the base 310, because the upper cover portion 200 is rotated to trigger the sensing unit 700 in relation to the base 310, the sensing unit 700 starts to send the above-mentioned triggering instruction to the controlling unit 600. Thus, the controlling unit 600 controls the electrically-controlled driving devices 500 to synchronously move the sliding cover 400. In a specific embodiment, the sensing unit 700 is, for example, a lid switch or a Hall sensor.

Figure 9:
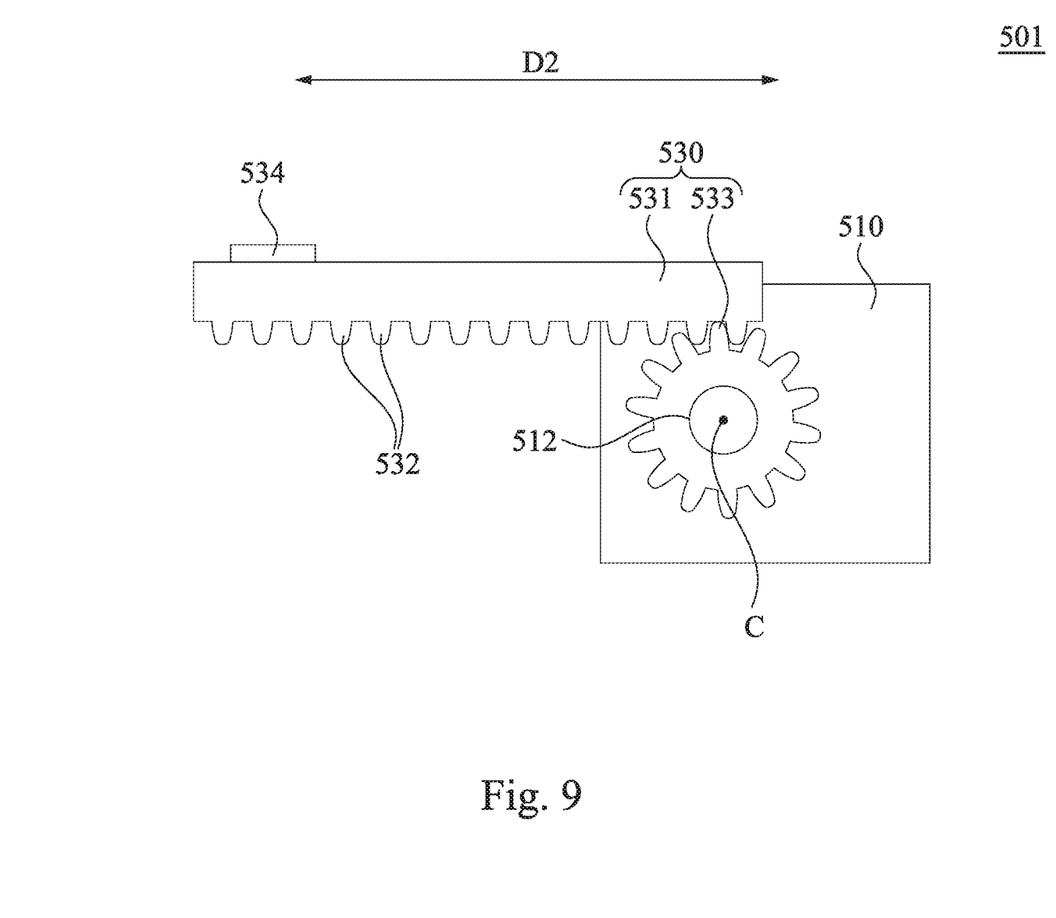
FIG. 9 is a schematic diagram of an electrically-controlled driving device according to an embodiment of the present disclosure.

FIG. 9 is a schematic diagram of an electrically-controlled driving device 501 according to an embodiment of the present disclosure. As shown in FIG. 9, the electrically-controlled driving device 501 of the specific embodiment is substantially the same as the electrically-controlled driving device 500 of the foregoing embodiment above. One of the differences is that, the linkage set 530 of the electrically-controlled driving device 501 of the specific embodiment does is provided without the aforementioned stud 521 and the aforementioned linear moving member 522. Instead, the linkage set 530 of the electrically-controlled driving device 501 of the specific embodiment does is provided with a toothed rack 531 and a gear wheel 533. The gear wheel 533 is coaxially fixed to the rotating shaft 512 of the electric motor 510 so that the gear wheel 533 can rotate synchronously with the rotating shaft 512 of the electric motor 510. The toothed rack 531 is provided with a plurality of tooth ribs 532 which are equally-spaced arranged on a surface of the toothed rack 531. The gear wheel 533 is engaged with the toothed rack 531, and the toothed rack 531 is connected to the sliding cover 400 through a connection pad 534. Therefore, when the rotating shaft 512 of the electric motor 510 starts to rotate, the rotating shaft 512 of the electric motor 510 moves the aforementioned sliding cover 400 with the gear wheel 533 in a second linear direction D2 which is perpendicular to the shaft center line C of the rotating shaft 512 of the electric motor 510.

In a specific embodiment, the electric motor 510 can also be fixed to the sliding cover 400, and the electric motor 510 and the base 310 are connected through the linkage set 530 for moving the sliding cover 400.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. A portable electronic device, comprising:
  a pivot device;
  a mainframe computer, comprising:
    a base,
    two roller mechanisms oppositely formed on two opposite sides of the base, wherein each of the roller mechanisms comprises a protruding post disposed on the base, and a roller pivotally provided at one end of the protruding post through a bolt, and
    a receiving recess concavely formed on a top surface of the base;
  an upper cover portion pivotally connected to the base through the pivot device;

a screen portion located on the upper cover portion;
a decorative plate disposed on the top surface of the base, and arranged between the receiving recess and the screen portion, a plurality of vent holes being formed and distributed on the decorative plate, respectively, each of the vent holes penetrating through the decorative plate to be in communication with the receiving recess;
a sliding cover slidably disposed on the top surface of the base, covering the receiving recess, a part of the decorative plate and a part of the vent holes formed on the part of the decorative plate, the sliding cover comprising two guide grooves oppositely formed on two opposite sides of the sliding cover, wherein
 the roller of each of the roller mechanisms is located in one of the guide grooves to abut against an inner wall of the one of the guide grooves, so that the roller is rotatable along the inner wall of the one of the guide grooves, and any of lateral sides of the sliding cover is free from being mechanically attached to the upper cover portion;
a keyboard device having pressing keys disposed on the sliding cover; and
at least one electrically-controlled driving device, comprising:
 an electric motor; and
 a linkage set that is connected to the electric motor and the sliding cover, wherein
 the electric motor drives the linkage set to linearly slide the sliding cover along the top surface of the base, so that the sliding cover is allowed to cover the vent holes and expose the vent holes from the base,
wherein when the sliding cover is linearly slid away from the screen portion, the sliding cover exposes the part of the vent holes on the decorative plate.

2. The portable electronic device of claim 1, wherein
the electric motor is fixedly disposed within the receiving recess, and the at least one electrically-controlled driving device further comprises a guide frame that is disposed in the receiving recess, fixedly connected to the base and the electric motor, and formed with a position-limiting space therein; and
the linkage set comprises a stud and a linear moving member, and the stud is coaxially fixed to a rotating shaft of the electric motor, and rotatably located in the position-limiting space, and the linear moving member is screwed on the stud, and movably limited within the position-limiting space, for linearly moving in relation to the stud in a linear direction which is parallel to the rotating shaft of the electric motor.

3. The portable electronic device of claim 1, wherein the linkage set comprises a toothed rack and a gear wheel, the gear wheel is coaxially fixed to a rotating shaft of the electric motor, and is engaged with the toothed rack, the toothed rack is connected to the sliding cover, for moving the sliding cover with the gear wheel in a linear direction, wherein the linear direction is perpendicular to a rotating shaft of the electric motor.

4. The portable electronic device of claim 1, wherein
the mainframe computer further comprises a fan device that is disposed in the receiving recess,
wherein the base is formed with a plurality of air inlet holes, the air inlet holes are distributed on one bottom surface of the base being opposite to the top surface, and the air inlet holes are in communication with the vent holes through the receiving recess, and the fan device produces airflows introduced from the air inlet holes to the vent holes.

5. The portable electronic device of claim 1, wherein the mainframe computer further comprises:
a controlling unit disposed within the receiving recess, and electrically connected to the at least one electrically-controlled driving device and the keyboard device,
wherein when one of the pressing keys of the keyboard device is triggered, the controlling unit controls the at least one electrically-controlled driving device to move the sliding cover to cover the vent holes and expose the vent holes from the base according to an instruction of the one of the pressing keys.

6. The portable electronic device of claim 5, wherein the at least one electrically-controlled driving device is two in number, and the electrically-controlled driving devices are oppositely disposed within the receiving recess,
wherein the controlling unit synchronously controls the two electrically-controlled driving devices to move the sliding cover together, so that the sliding cover is moved to cover the vent holes and expose the vent holes from the base.

7. The portable electronic device of claim 1, wherein the mainframe computer further comprises:
a sensing unit; and
a controlling unit disposed within the receiving recess, and electrically connected to the at least one electrically-controlled driving device and the sensing unit,
wherein when the upper cover portion is rotated to trigger the sensing unit in relation to the base, the controlling unit controls the at least one electrically-controlled driving device to move the sliding cover to cover the vent holes and expose the vent holes from the base according to a trigger instruction of the sensing unit.

8. The portable electronic device of claim 1, wherein the electric motor is a stepping motor or a servo motor.

* * * * *